United States Patent
DiOrio (10) Patent No.: US 7,405,581 B2
(45) Date of Patent: Jul. 29, 2008

(54) PROBING SYSTEM USES A PROBE DEVICE INCLUDING PROBE TIPS ON A SURFACE OF A SEMICONDUCTOR DIE

(75) Inventor: Mark L. DiOrio, Cupertino, CA (US)

(73) Assignee: Novellus Development Company, LLC, San Jose, CA (US)

( * ) Notice: Subject to any disclaimer, the term of this patent is extended or adjusted under 35 U.S.C. 154(b) by 272 days.

(21) Appl. No.: 10/718,031

(22) Filed: Nov. 19, 2003

(65) Prior Publication Data

US 2004/0217769 A1 Nov. 4, 2004

Related U.S. Application Data

(63) Continuation-in-part of application No. 10/428,572, filed on May 1, 2003, now Pat. No. 6,984,996.

(51) Int. Cl.
G01R 31/02 (2006.01)
(52) U.S. Cl. ...................................... 324/754
(58) Field of Classification Search ................ 324/765, 324/754, 158.1, 755, 762, 761; 439/482, 439/700; 29/846, 852
See application file for complete search history.

(56) References Cited

U.S. PATENT DOCUMENTS

| | | | |
|---|---|---|---|
| 5,055,778 A | 10/1991 | Okubo et al. | |
| 5,289,631 A | 3/1994 | Koopman et al. | |
| 5,513,430 A * | 5/1996 | Yanof et al. | 29/846 |
| 5,604,446 A | 2/1997 | Sano | |
| 5,625,298 A * | 4/1997 | Hirano et al. | 324/754 |
| 5,642,056 A * | 6/1997 | Nakajima et al. | 324/758 |
| 5,804,983 A * | 9/1998 | Nakajima et al. | 324/758 |
| 5,808,474 A | 9/1998 | Hively et al. | |
| 5,828,225 A * | 10/1998 | Obikane et al. | 324/758 |
| 6,075,373 A * | 6/2000 | Iino | 324/754 |
| 6,292,007 B1 | 9/2001 | Potter | |
| 6,359,456 B1 | 3/2002 | Hembree et al. | |
| 6,379,982 B1 * | 4/2002 | Ahn et al. | 438/14 |
| 6,426,636 B1 * | 7/2002 | Das et al. | 324/754 |
| 6,426,637 B1 | 7/2002 | Dang et al. | |
| 6,426,639 B2 | 7/2002 | Farnworth et al. | |
| 6,480,012 B1 * | 11/2002 | Komori | 324/754 |
| 6,551,844 B1 | 4/2003 | Eldridge et al. | |
| 6,552,555 B1 * | 4/2003 | Nuytkens et al. | 324/754 |
| 6,621,260 B2 * | 9/2003 | Eldridge et al. | 324/158.1 |
| 6,621,710 B1 * | 9/2003 | Cheng et al. | 361/774 |
| 7,112,975 B1 * | 9/2006 | Jin et al. | 324/754 |
| 2002/0171449 A1 | 11/2002 | Shimizu et al. | |

FOREIGN PATENT DOCUMENTS

EP 0845677 A1 6/1998

* cited by examiner

*Primary Examiner*—Paresh Patel
(74) *Attorney, Agent, or Firm*—David T. Millers (57) ABSTRACT

A probing system for electrical testing of a semiconductor device uses a probe device including probe tips on a surface of a semiconductor die. The probe tips can be fabricated as metal bumps on contact pads having a pattern that is the same as the pattern of contact pads on the semiconductor device. The semiconductor die can provide the probe device with substantially the same thermal properties as the semiconductor device, so that the same probe can be used for testing over a broad temperature range. Further, the probe device can be fabricated using semiconductor device fabrication techniques, so that probe designs can scale down as device fabrication techniques move to smaller dimensions.

14 Claims, 8 Drawing Sheets

PROBING SYSTEM USES A PROBE DEVICE INCLUDING PROBE TIPS ON A SURFACE OF A SEMICONDUCTOR DIE

CROSS-REFERENCE TO RELATED APPLICATION

This patent document is a continuation-in-part and claims benefit of the earlier filing date of U.S. patent application Ser. No. 10/428,572, filed May 1, 2003 now U.S. Pat. No. 6,984,996, which is hereby incorporated by reference in its entirety.

BACKGROUND

Testing of integrated circuit devices identifies devices that are defective and also provides information regarding the yield of or problems in the fabrication process. Preferably testing is performed early in the fabrication process to avoid wasted processing of defected parts and to identify process problems before a correctable problem affects multiple batches. Wafer probing in particular permits early electrical testing of integrated circuit devices before the devices are separated from a wafer. The devices identified as being defective or bad can then be discarded before being packaged. Further, corrections or adjustments to the fabrication process can be made without the additional delay that would result if devices were only tested after being packaged.

Figure 1:
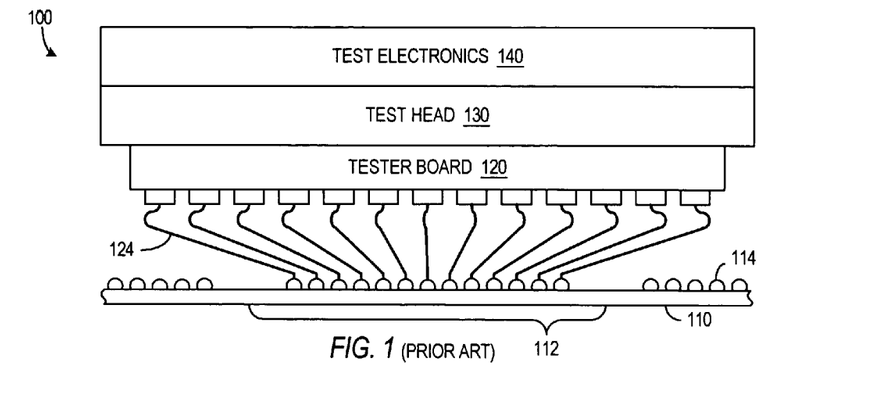
FIG. 1 shows conventional test equipment for wafer probing.

FIG. 1 illustrates conventional test equipment 100 for the testing of an integrated circuit device 112 fabricated on a wafer 110. Wafer 110 generally is a semiconductor wafer that includes multiple devices 112. For testing, a prober or other positioning system (not shown) moves wafer 110 or a test head 130 to align a test board 120 with the device 112 currently selected for testing. On test board 120 are pins 124 arranged to match the pattern of electrical terminals 114 on each device 112. When test board 120 is appropriately aligned with the selected device 112, pins 124 and terminals 114 are brought together to provide electrical connections between the selected device 112 and test board 120. Pins 124, test board 120, and test head 130 can then relay electrical signals between the selected device 112 and test electronics 140.

Test equipment 100 is generally designed to avoid or minimize damage to devices 112, particularly where pins 124 contact terminals 114. In FIG. 1, pins 124 are cantilevered to provide flexibility that limits the force that pins 124 apply to terminals 114. Some other similar test equipment designs use spring-loaded pins that similarly cushion or limit the force applied to devices 112 during testing.

A disadvantage of pins 124 being flexible is the ease with which pins 124 become misaligned. When one of pins 124 is bent during cleaning or use, for example, that pin 124 will often fail to make a good electrical contact with the target terminal 114, resulting in a failed test. Further, a difference in the thermal properties of wafer 110 and test board 120 or pins 124 limits the temperature range at which pins 124 will suitably match the pattern of terminals 114. Particularly, pins 124 are long relative to the size of device 112 and will proportionally change in length when the temperature changes.

Figure 2:
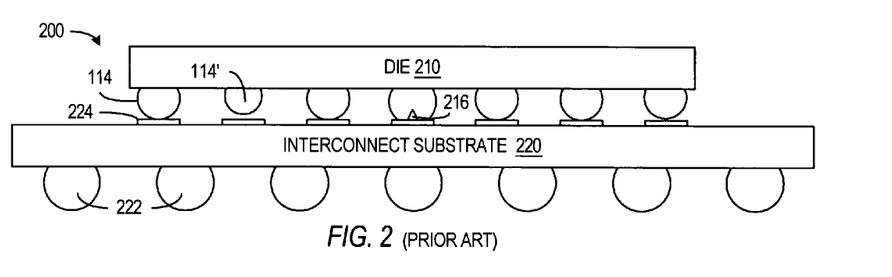
FIG. 2 shows a conventional flip-chip package containing defects that arise from testing and uneven solder bumps.

Damage or abrasion that testing causes on terminals 114 can be a problem even when pins 124 are compliant, and such damage is particularly problematic when device 112 is designed for flip-chip packaging. FIG. 2 illustrates a flip-chip package 200 including a die 210 and an interconnect substrate 220. Die 210 contains a device 112 that has been separated from a wafer such as wafer 110 of FIG. 1. Flip-chip packaging attaches metal bumps, which form elevated electrical terminals 114 on device 112, to pads 224 on interconnect substrate 220. Interconnect substrate 220 then provides electrical connections between die 210 and external terminals 222.

Sharp test pins 124 that contact terminals 114 before the packaging process can leave gouges 216 in terminals 114, particularly when the contacted portion of terminals 114 are relatively soft metal such as solder. Gouges 216 can trap contaminants such as oxidation or soldering flux that weaken joints between terminals 114 and pads 214, resulting in a less dependable package.

Another potential problem in flip-chip packages arises from the non-uniformity of terminals 114. In particular, for a reliable attachment of terminals 114 to pads 214, the tops of terminals 114 and pads 214 should lie in a plane corresponding to the packaging substrate. FIG. 2 illustrates the problem of a terminal 114' that fails to extend to or make a reliable connection with a corresponding pad 214. The formation process for terminals 114 would typically be the cause of non-uniform terminals 114, but pins 124 can abrade selected terminals 114 during testing and further disrupt planarity, making reliable packaging more difficult.

SUMMARY

In accordance with an aspect of the invention, a probing system uses a semiconductor probe device that is manufactured using some of the same processes and materials as used for the device being tested. In particular, the semiconductor probe device can include a semiconductor die and contact pads formed on the die using the same mask as used to form contact pads on the tested devices. The contact pads can act as probe tips, or conventional wafer bumping processes can form probe tips on the semiconductor probe device. Electrical connections to the probe tips can be fabricated using conductive traces, wire bonding, tape bonding, or other techniques conventionally used in semiconductor device fabrication. The probe tip pattern can scale to the required size of semiconductor devices when processes or designs change since semiconductor fabrication processes used to form devices being tested can also form the probe device including the probe tips. Using a semiconductor probe device containing materials that are the same as or similar to those in devices being tested matches the thermal properties of the probe device and the tested devices and therefore permits testing over a wide temperature range.

One specific embodiment of the invention is a probing system for testing a device. The probe in the probing system includes a semiconductor die on which probe tips reside. The probe tips, which can be electrically connected to a tester, are arranged in a pattern that matches the pattern of terminals on the device. The semiconductor die in the probe can be made of substantially the same material as the device to provide thermal matching of the device and the probe. Electrical connections of the tester to the probe tips can be made through traces formed on a top surface of the die or through conductive vias that pass through semiconductor die. The probe optionally includes a substrate or printed circuit board on which the semiconductor die is mounted, and in one configuration, the probe assembly including the semiconductor die with or without an attached substrate fits into a receptacle on a probe card. This permits the probe to be removed and replaced when damaged or for testing of a different type of device.

Another embodiment of the invention is a probe card for electrical testing of a device. The probe card includes a first substrate adapted for mounting on test equipment; a receptacle mounted on the first substrate; and a probe in the receptacle. The probe, which may be detachably mounted in the receptacle, has probe tips that are on a top surface of a semiconductor die and arranged in a pattern that matches a pattern of terminals on the device.

Still another embodiment of the invention is a method for forming a probe for electrical testing of a semiconductor device. The method includes: forming probe tips on a semiconductor die in a pattern matching the pattern of terminals on the semiconductor device; and fabricating an interconnect structure for electrical connection of the probe tips to test equipment. The process of forming the probe tips can include forming contact pads on the semiconductor die and then forming conductive bumps on a surface of the contact pads. The interconnect structure can be formed either with the probe tips on the top surface of the semiconductor or with conductive vias passing from the top surface to the bottom surface of the semiconductor die.

BRIEF DESCRIPTION OF THE DRAWINGS

Use of the same reference symbols in different figures indicates similar or identical items.

DETAILED DESCRIPTION

In accordance with an aspect of the invention, a wafer probing process for electrical testing of a device fabricated on a wafer also conditions the terminals on the device to improve uniformity of the heights of the terminals. The good devices when separated from the wafer are thus in better condition to provide reliable bonds to an interconnect substrate in a flip-chip package or to a circuit board when the chip is instead assembled in a "chip-on-board" application. The wafer probe can employ a probe card that is substantially identical to all or part of a printed circuit board or an interconnect substrate to which the device will be attached. Alternatively, the wafer probe can employ a semiconductor probe device that is similar to the devices being tested. Probe tips on the probe card or device can be the flat contact pads or bumps that are the normal electrical contact structures of the interconnect substrates. Alternatively, probe tips having a desired shape and size can be formed on the probe card or device to provide desired deformations of the metal bumps on the devices.

Figure 3:
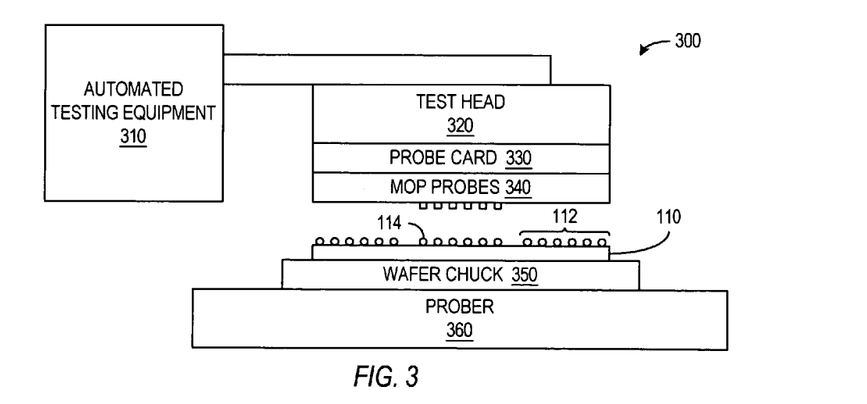
FIG. 3 illustrates wafer-probing equipment in accordance with an embodiment of the invention.

FIG. 3 is a block diagram of a test system 300 in accordance with an exemplary embodiment of the invention. Test system 300 includes automatic test equipment (ATE) 310, a test head 320, a probe card 330 including metal on pad (MOP) probe tips 340, a wafer chuck 350, and a prober 360. Test system 300 electrically tests devices 112, which are fabricated on a wafer 110, and in the process also conditions terminals 114 of devices 112 to improve the planarity of terminals 114.

Devices 112 can generally be any type of device including but not limited to a memory, a controller, a processor, an application specific integrated circuit (ASIC), or any other type of integrated circuit or separate device. As terminals 114, devices 112 may have metal bumps that rise above a top surface of wafer 110 by a height that is sufficient for flip-chip packaging or attachment to a printed circuit board. For current flip-chip packaging process, terminals 114 typically have an average height of between about 60 µm and about 700 µm, with 100 µm as a typical average height. Each terminal 114 may, for example, be a solder ball or a composite structure containing multiple metal layers such as stacked solder balls, a copper or other metal pillar that is capped with a solder layer, a solder ball, a gold layer, or a gold stud. Alternatively, terminals 114 can be pads that will be electrically connected using wire bonding or some other packaging techniques.

For a probing operation that electrically tests a selected device 112 on wafer 110, a probe card 330 with MOP probes 340 in a pattern that matches the pattern of terminals 114 on a device 112, is mounted on test head 320. MOP probes 340 can either be metal probes directly formed on probe card 330, on a separate printed circuit board or interconnect substrate that is attached to probe card 330, or on a semiconductor probe device that is electrically connected to probe card 330. Wafer 110, which is typically made of silicon (Si) or another semiconductor material, is then placed on wafer chuck 350. Prober 360 operates to position and orient wafer chuck 350 so that terminals 114 for the selected device or devices 112 are aligned with MOP probes 340.

As an illustrative example, the following describes testing of one device 112 at a time when terminals 114 include metal bumps that require conditioning to improve planarity. As will be apparent to those skilled in the art, multiple devices could be simultaneously tested if desired, and testing could be performed on devices with other types of terminals or without altering the terminals. In the exemplary test process, prober 360 drives chuck 350 up until terminals 114 on the aligned device 112 make electrical contact with MOP probes 340 and MOP probes 340 begin to inelastically deform terminals 114. ATE 310 then applies electrical input signals through test head 320 and probe card 330 to the terminals 114 and measures the resulting output signals from the selected device 112 to determine whether the device 112 is functional and provides the required performance.

ATE 310 and prober 360 can be standard test equipment that is available commercially from a variety of suppliers including Agilent Technologies, Inc., Teradyne, Inc., and LTX Corporation. ATE 310 generally performs the electrical testing of devices 112 in a conventional manner that depends on the type of device 112. Prober 360 which controls the positioning of wafer 110 relative to MOP probes 340 is preferably capable of measuring a distance between the top surface of wafer 110 and probe card 330 or capable of precisely controlling an amount of upward movement of wafer 110 after the initial contact with probe card 330. Alternatively, probe card 330 can be moved to control the relative position of wafer 110. The ideal distance between the top surface of wafer 110 and the MOP probes 340 during testing will depend on the height of terminals 114 above the surface of wafer 110 as described further below.

In accordance with an aspect of the invention, MOP probes 340 on probe card 330 have limited compliancy to facilitate deformation of terminals 114 during probing. Probe card 330 can, for example, be a bumped or unbumped interconnect substrate that is suitable for use in a flip-chip package containing a device 112 being packaged. Such interconnect substrates are typically made of an organic material such as polyamide or other insulating material and contain conductive traces that electrically connect bumps or contact pads on one side of the interconnect substrate to contact pads and/or a ball grid array (BGA) on an opposite side of the interconnect substrate. Alternatively, MOP probes 340 can be on a printed circuit board, an interconnect substrate, or a semiconductor probe device that is electrically connected to probe card 330. MOP probes 340, which contact terminals 114 of the device 112 for electrical testing, are able to apply sufficient pressure to provide good electrical connections and further to cause deformation of terminals 114.

Probe card 330 and MOP probes 340 as indicated above could be one homogeneous/integrated structure or separable elements. Test heads are generally standard devices, and a base part of probe card 330 can be designed according to the appropriate standard and attached to test head 320. However, in the illustrated embodiment of the invention, MOP probes 340 can be on a separate substrate, device, or assembly attached as a removable part of probe card 330. This permits use of probe card 330 with different MOP probes 340 for testing different devices. A probe card 330 with replaceable MOP probes 340 further has the advantage of permitting quick replacement of damaged probe tips so that downtime of ATE 310 is minimized.

Probe card 330 can be rigidly mounted or spring mounted on test head 320 to provide a limited compliancy to probe card 330 as a whole. The amount of compliancy can range from about 0 for a non-compliant or rigid mounting up to about 15 mils or more for a spring mounting. The desired deformation or planarization of device terminals 114 during probing, as described further below, will generally control selection of a fixed or compliant mounting, the maximum travel distance of a compliant mounting, the number of springs or other compressible structures between test head 320 and probe card 330 in a compliant mounting, and the spring constant or modulus of the compressible structures in a compliant mounting.

MOP probes 340, which can be created using printed circuit board technology or device bumping, have the advantage of being easily configured to match a specific device or multiple devices for parallel testing. In contrast, a probe card having cantilevered or spring loaded probes must typically be larger than the device to accommodate the size of the probes, and arranging the probes to match one or more devices can be complicated.

Another advantage of compact and non-compliant MOP probes 340 is their durability when compared to needle, spring, or cantilever probes used in conventional probing equipment. MOP probes 340 thus maintain proper alignment without requiring adjustment and without fear of bending. MOP probes 340 can also be cleaned, for example, with a brush or other mechanical cleaning techniques without damaging or misaligning the probes.

MOP probes 340 can also have relatively large flat contact areas, as described further below. The flat contact areas, besides being less likely to be damaged during use and cleaning, do not have protrusions or sharp points that pick up and hold particles. As a result, MOP probes 340 can continue to provide low contact resistance to the device under test even after prolonged use without cleaning.

Figure 4A:
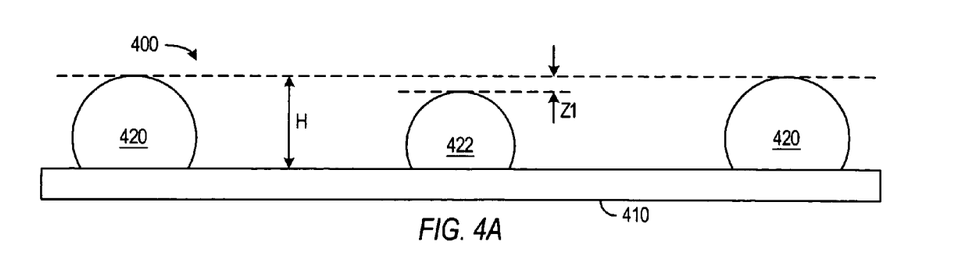
FIG. 4A shows a set of metal bumps before wafer probing.

FIG. 4A illustrates a portion of a device 400 fabricated in and on a substrate 410. Device 400 includes bumps 420 and 422 that can be solder balls or other conductive structures that act as the electric terminals. Ideally, all of bumps 420 and 422 rise to the same height H above the surface of substrate 410, but bumps 420 and 422 are subject to manufacturing variations that may cause some bumps 422 to differ by a distance Z1 from the standard height H. If the distance Z1 is too large for any bump 422, a weak or defective joint will result during flip-chip bonding as described above in regard to FIG. 2.

Figure 4B:
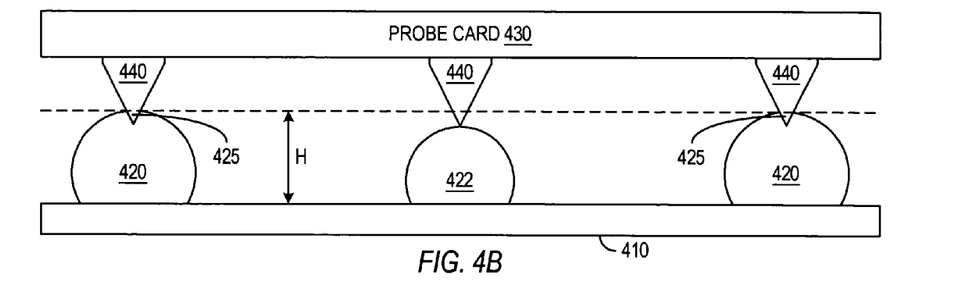
FIGS. 4B, 4C, and 4D show the metal bumps of FIG. 4A after wafer probing using illustrated probe tips in accordance with alternative embodiments of the invention.

FIG. 4B illustrates how bringing a probe card 430 having probe tips 440 that are sharp and rigid into contact with all bumps 420 and 422 on a device can gouge bumps 420. In particular, when a probe tip 440 travels a sufficient distance to electrically contact an undersized bump 422, other probe tips 440 sink into larger bumps 420, creating narrow gouges 425. Narrow gouges 425 thus formed in the larger bumps 420 can trap contaminants and weaken the electrical connections to the larger bumps 420. Additionally, the sharp probe tips 420 do little to improve the disparities in the heights of bumps 420 and 422, so that the inherent variation in the heights of bumps 420 and 422 may still result in weak or defective electrical connections in a flip-chip package or die attachment to a printed circuit.

Figure 4C:
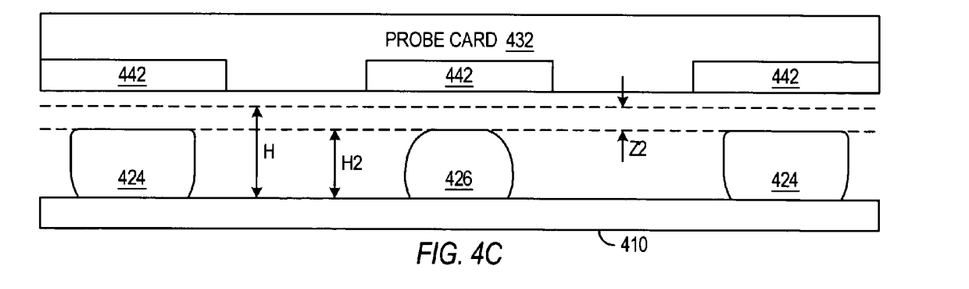

FIG. 4C illustrates a system including a probe card 432 in accordance with an embodiment of the invention having flat probe tips 442. Flat probe tips 442 preferably have a width that is at least one half of the diameter of bumps 420 and 422. In one embodiment of the invention, probe card 432 is a printed circuit board and probe tips 442 are contact pads or metal traces on a surface of the printed circuit board. In another embodiment of the invention, probe tips 442 are contact pads of a semiconductor probe device having a pattern of contact pads that match the pattern of bumps 420 and 422 on the device being tested. Probe tip 442 should be made of a metal capable of avoiding inelastic deformation while applying the forces required for inelastic deformation of the device terminals 420 and 422. A material such as copper is suitable for probe tips 442 when the device terminals 420 and 422 contain a malleable material such as a solder.

FIG. 4C shows probe tips 442 as being level with the surface of probe card 432, but alternatively probe tips 442 may rise above the surface of probe card 432 or even be recessed relative to the remainder of the surface of probe card 432. However, probe card 432 should allow the bottoms of probe tips 442 to reach the desired separation from the top of wafer 410.

For the probing operation using probe card 432, a prober first drives wafer 410 and/or probe card 432 so that the bottoms of probe tips 442 contact at least some of the corresponding bumps 420, and the top surface of wafer 410 is about distance H from the bottoms of probe tips 442. The prober then further drives wafer 410 and/or probe card 432 closer by an overtravel distance Z2. This process flattens bumps 420 that are height H or taller and bumps 422 that are at least a height H2 (H2=H−Z2). The resulting deformed bumps 424 and 426 are more uniformly of the same height H2. The tops of bumps 424 and 426 thus have better planarity than do bumps 420 and 422, and the improved planarity can enhance the interconnect joint integrity in a flip-chip package or a chip-on-board application containing the probed device.

For one embodiment of the invention, probe card 432 can be the same as the interconnect substrates (e.g., interconnect substrate 220 of FIG. 2) that will be used in the flip-chip packaging of the device after testing. Probe tips 442 then are the same as the contact pads that are soldered to bumps 424 and 426, for example, during a conventional reflow operation that electrically connects the device to the interconnect substrate of a flip-chip package. Alternatively, probe card 432 can include a semiconductor probe device that is substantially the same as the device under test or at least which has a contact pad pattern matching that of the devices under test.

Overtravel distance Z2 generally must at least be sufficient to provide a low contact resistance at each terminal 424 and 426 to permit electrical testing of the device. Even a small overtravel distance Z2 (e.g., the minimum overtravel required for electrical testing) generally results in a flattening of the largest of the bumps, improving the overall planarity of the bumps and therefore improving the integrity of interconnection joints in a subsequently-created flip-chip package. Larger amounts of overtravel may provide further improvements in planarity until the overtravel distance Z2 provides some flattening of all bumps 420 and 422. After the point where each of the bumps 420 and 422 is at least partially flattened, the variations in the planarity of bumps 424 and 426 depends on the variations in the planarity and the compliancy of probe tips 442.

Figure 5A:
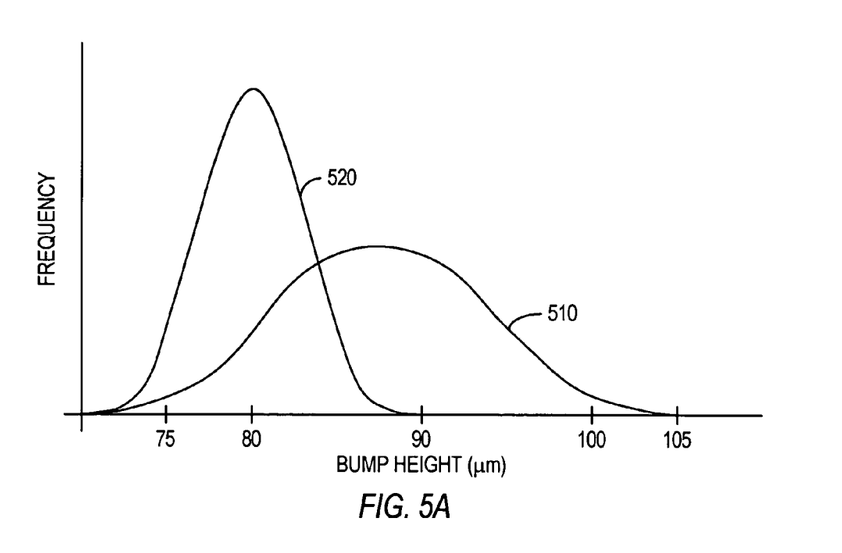
FIGS. 5A and 5B show plots illustrating the distribution of bump heights for device before and after a wafer probing process in accordance with an embodiment of the invention.

FIG. 5A shows an example of a distribution 510 of bump heights before probing and a distribution 520 of bump heights after probing. In this example, the fabrication process creates bumps that nominally have a height and width of about 90 µm, but with a variation such that a few bumps may be as tall as about 105 µm or as short as about 75 µm. The probing process, for this example, then drives the wafer and the probe card so that the average separation between the wafer and the bottoms of the probe tips is about 80 µm. When the probe card is withdrawn, the resulting distribution 520 includes bumps taller and shorter than 80 µm because of the tolerances and because the shorter terminals 422 may only undergo elastic deformations.

Figure 5B:
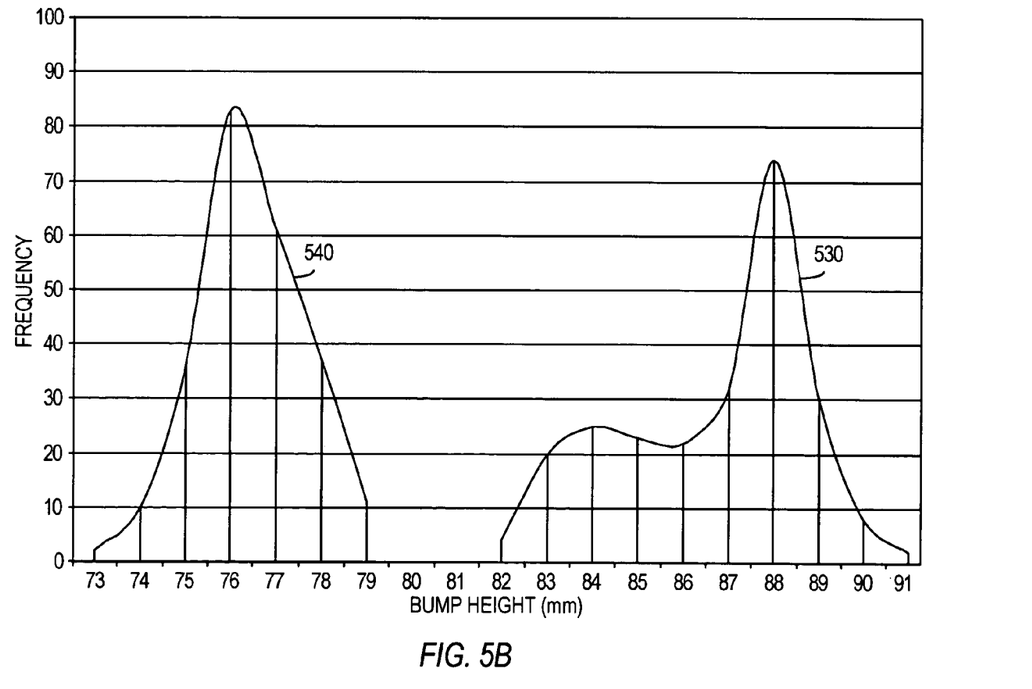

FIG. 5B shows another example distribution 530 of bump heights before probing and a resulting distribution 540 of the bump heights after probing. Before the probing operation, the bumps have an average height near 88 µm, and the shortest bump height is about 82 µm. In the example of FIG. 5B, the probing operation drives the wafer and the probe card until the average separation between the wafer and the bottoms of the probe tips is less than the shortest bump height before the probing. As a result, when the probe card is withdrawn, all of the bumps have heights that are about as short as or shorter than the shortest of the bump heights in the pre-probing distribution 530. Distribution 540 thus includes shorter bump heights but is also much narrower than distribution 530, indicating that the bumps have improved planarity after probing.

The overtravel distance Z2 used during probing may need to be limited to avoid damaging the device because compression of bumps 420 and 422 can cause damaging stress on underlying portions of the device 410. The amount of stress introduced generally depends on overtravel distance Z2 and the structure of bumps 420. Bumps 420 and 422 made of a malleable material such as lead-based or eutectic solder can be inelastically deformed without creating stress that damages the underlying structure of a typical semiconductor device. Bumps containing a less-malleable solder and/or more rigid structures such as copper (Cu) pillars will tolerate smaller overtravel distance Z2 before the risk of damaging the underlying structure becomes too great.

Another factor in choosing an overtravel distance Z2 for the probing/planarization operation is the desired deformed profile of bumps. Overtravel distances that are larger than necessary to provide good electrical contact may provide more flattening and larger flat areas at the tops of bumps 424 and 426. For attachment of the device to an interconnect substrate, the flat areas at the tops of solder bumps are brought into contact with the contact pads or bumps on the interconnect substrate. A reflow process then at least partially liquefies the solder, and each flattened solder bump tends to reshape itself into a spherical shape to minimize surface tension. The flattened solder balls thus naturally extend toward the interconnect wafer during the reflow process.

Figure 4D:
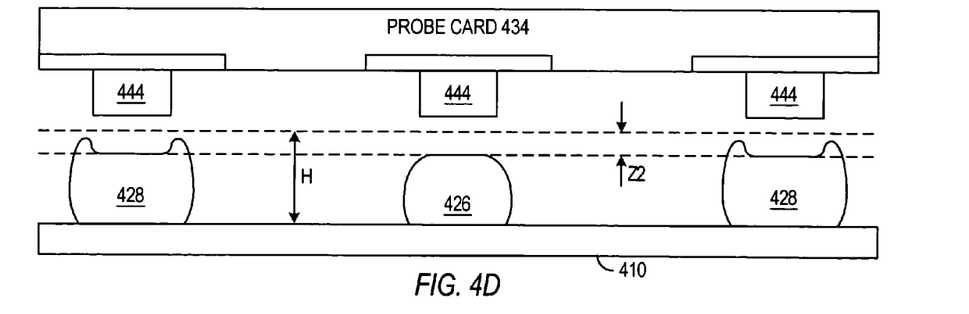

The conditioning of the tops of bumps 420 and 422 during probing is not limited to flattening the top surface of the bumps. Instead, bumps 420 and 422 can be imprinted or coined with any desired shape. FIG. 4D illustrates an example of a probe card 434 having probe tips 444 that extend above the surface of the probe card 434 and are smaller than the diameter of the bumps 420. Probe tips 444 may be, for example, about 50 µm wide while bumps 420 have diameters of about 90 µm. Such probe tips 444 may result from using a bumped interconnect substrate or semiconductor device as probe card 434.

During the probing process, probe tips 444 create a flattened top surface on a smaller bump 426 where the flattened area of bump 426 is smaller than the area of probe tip 444. Probe tips 444 however create concave top surfaces in larger bumps 428. Such concave surfaces are acceptable when the resulting cavities are neither narrow nor deep enough to entrap contaminants such as oxidation or soldering flux. The cavities can aid in the alignment of the device with a bumped interconnect substrate during the packaging process. The integrity of the soldered connections can thus be improved through improved alignment and the natural expansion of the deformed solder balls during a reflow process.

As mentioned above in regard to test equipment 300 of FIG. 3, a probe card having probe tips in accordance with the invention can either be a single integrated structure including the probe tips or a compound structure from which a part including the probe tips can easily be removed and replaced.

Figure 6A:
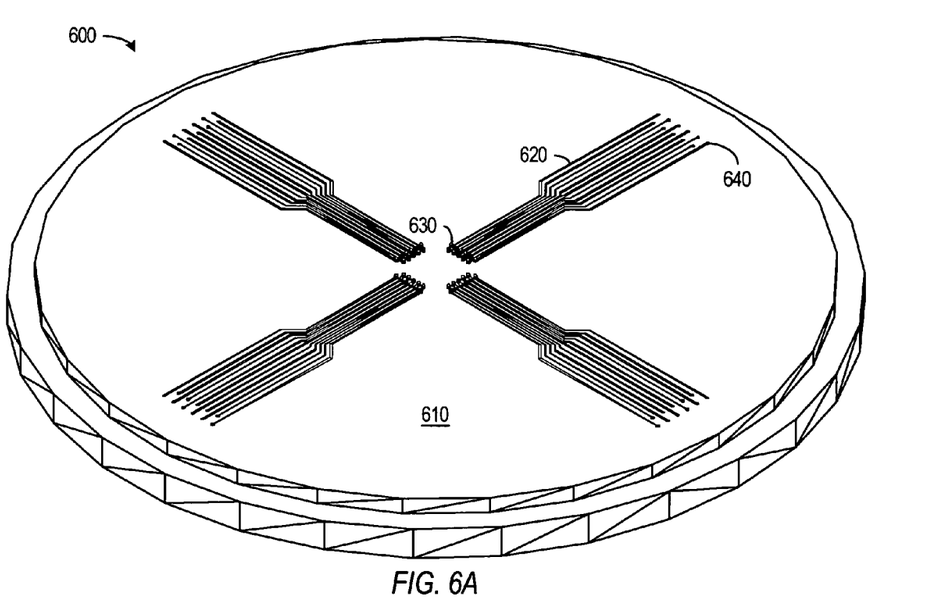
FIGS. 6A and 6B are perspective views of a probe card having integrated metal on pad probes in accordance with an embodiment of the invention.
Figure 6B:
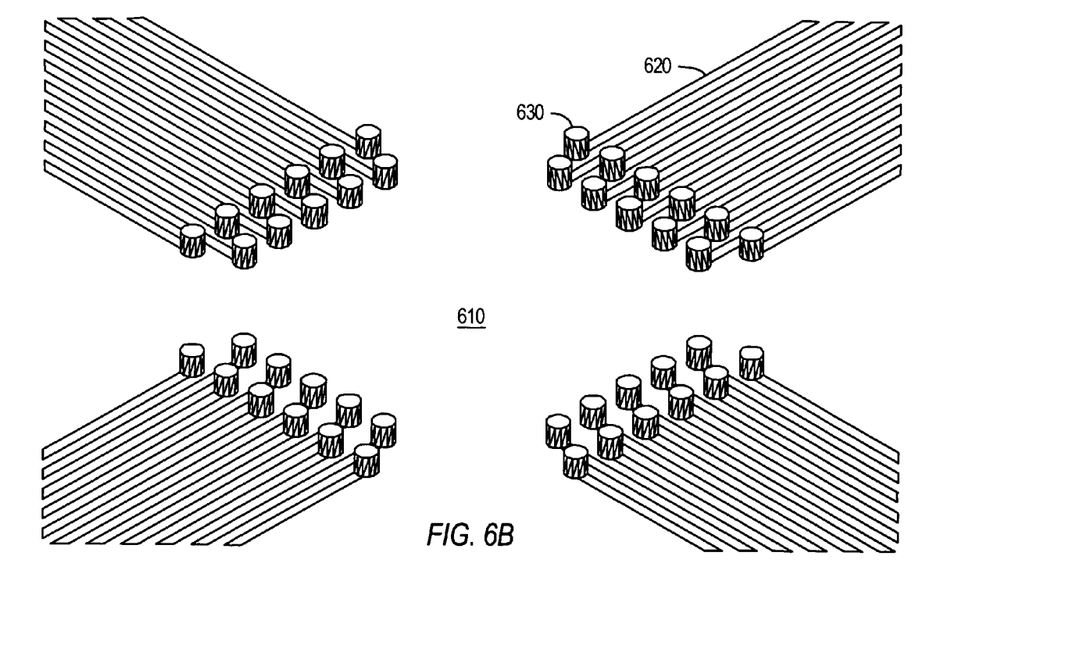

FIG. 6A shows an integrated probe card 600 in accordance with an embodiment of the invention. Probe card 600 includes a substrate 610, conductive traces 620, and probe tips 630. Substrate 610, which can be a printed circuit board, is made of an insulating material on and through which conductive traces 620 run. As illustrated, conductive traces 620 electrically connect probe tips 630 to vias 640 that lead to electrical contacts (not shown) on the side of substrate 610 that connects to a probe head. Probe tips 630, as shown in greater detail in FIG. 6B, can be carefully formed as flat-topped metal bumps or pillars on pad portions of conductive traces 620. Alternatively, the pad portions of conductive traces 620 can function as probe tips as described above. In either case, the probe tips provide flat non-compliant surfaces that can be used during wafer probing to improve the planarity of the device terminals.

An integrated probe card such as probe card 600 has an advantage in that the connections between the device being tested and the probe head (e.g., probe tips 630, conductive traces 620, and vias 640) can be optimized to provide minimum impedance, which may be important for RF circuits or high frequency testing. However, probe tips 630, being fixed to substrate 610 can only be used to test devices that have terminals in a pattern that matches the pattern of probe tips 630. The entire probe card 600 must be changed when the test equipment begins testing another type of device or if probe tips 630 are damaged.

Figure 7A:
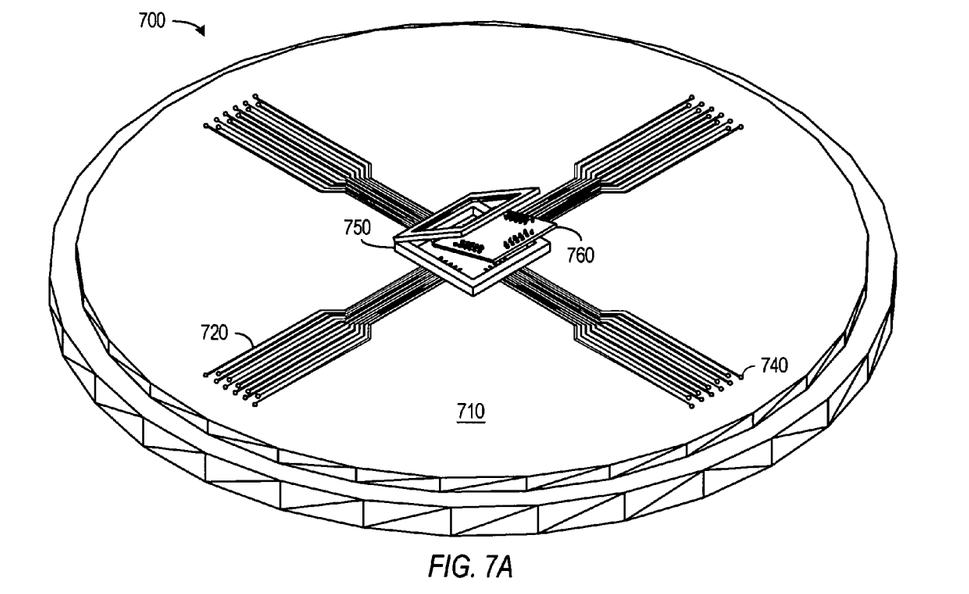
FIGS. 7A, 7B, and 7C show perspective views of a probe card in accordance with an embodiment of the invention in which probe tips are on replaceable probe assemblies.

FIG. 7A shows a probe card 700 in accordance with an embodiment of the invention that facilitates rapid changes or replacement of the probe tips to minimize test equipment downtime. Probe card 700 includes a first substrate 710, a receptacle 750, and a second substrate 760. Substrate 760 fits in or plugs into receptacle 750 and has affixed probe tips 730. Receptacle 750 is mounted on substrate 710, and when substrate 760 is in receptacle 750 conductive traces 720 in and on substrate 710 electrically connect substrate 760 to vias 740 leading to the electrical connections (not shown) for the test head. Accordingly, probe tips 730 electrically connect to the test equipment through substrate 760, receptacle 750, conductive traces 720, vias 740, and electrical contacts (not shown) on the back of substrate 710.

Each of substrates 710 and 760 can be made using conventional printed circuit technology, and in an exemplary embodiment of the invention, substrate 760 is identical to an interconnect substrate used in a flip-chip package for the device to be tested. Receptacle 750 can be any type of receptacle that can accommodate or provide electrical connections to substrate 760. In the illustrated embodiment of FIG. 7B, receptacle 750 includes pads 725 at the ends of conductive traces 720 that match and electrically connect to terminals (not shown) on the bottom of substrate 760. A hinged clamp then holds substrate 760 in place.

Figure 7B:
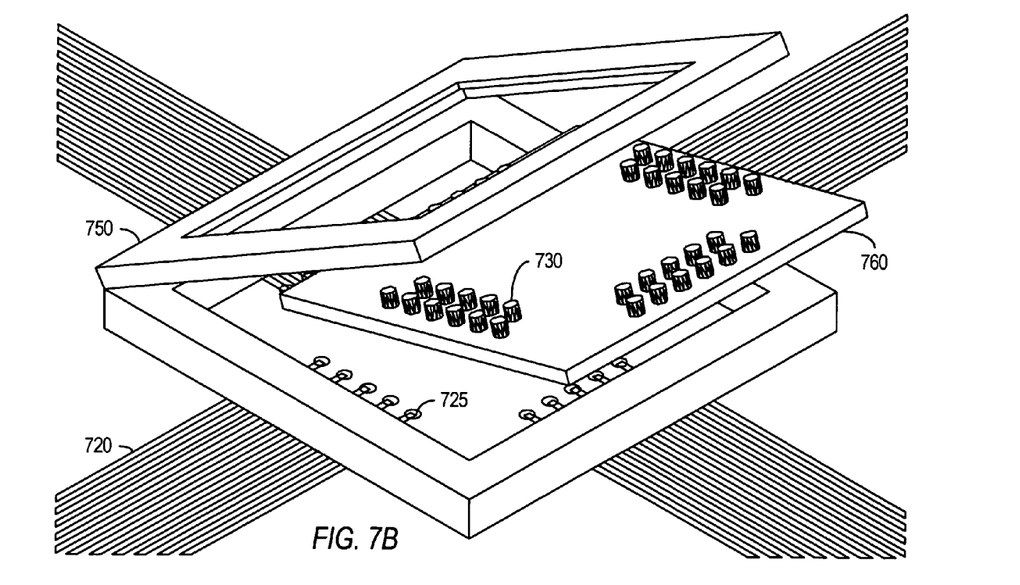
Figure 7C:
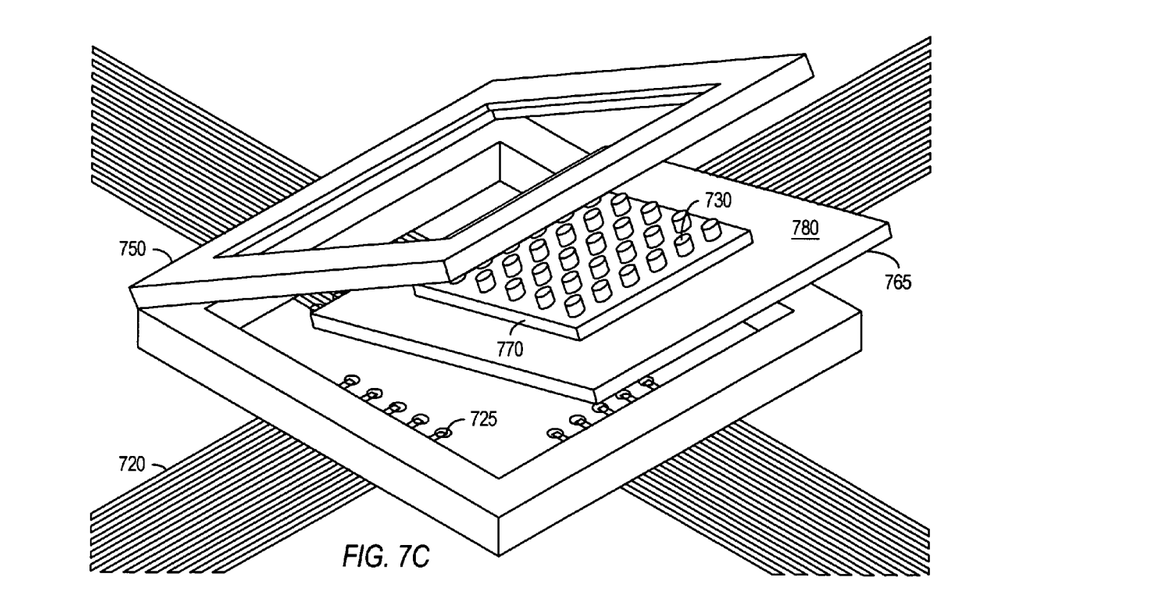

FIG. 7C shows an embodiment having an alternative substrate 765 that can be clamped in receptacle 750. Substrate 765 differs from substrate 760 in that substrate 765 includes a semiconductor device 770 on which probe tips 730 reside. Semiconductor device 770 can in turn be mounted on a printed circuit board 780 that fits into receptacle 750 and has terminals (not shown) that contact pads 725 at the ends of traces 720.

An advantage of probe card 700 is the ease with which substrate 760 or 765 can be changed while substrate 710 remains attached to the test equipment. Substrate 760 or 765 can, for example, be unclamped or unplugged and then removed from receptacle 750 without the need for unsoldering or any complicated disassembly. Substrate 760 or 765 can thus quickly be replaced with a new substrate whenever test equipment switches to testing devices having a different terminal pattern (e.g., after a die shrink) or when probe tips 730 are damaged. Such quick changes minimize the downtime of the test equipment.

Electrical probing and testing of a wafer at extreme temperatures is sometimes desired to identify and eliminate unreliable devices, to bin or categorize devices by performance or specification standards, or to qualify a device under specific operating temperatures or application conditions. An advantage of a probe card having compact probe tips instead of cantilevered or spring pins is the improved thermal stability of the probe card. A temperature change such as heating for an at-temperature test can cause a large change in the pattern of the conventional test pins because long pins expand considerably with increasing temperature. In contrast, the pattern of the probe tips thermally expands or contracts with the expansion or contraction of the relatively small interconnect substrate or semiconductor die. Further, when the probe tips are on a semiconductor die containing materials that are the same or similar to the materials in the device being tested, thermal expansion of the probe pattern matches thermal expansion of the pattern of contacted terminals on the device.

If the probe tips are on a material that differs from the device being tested, the probe tips can be designed to mechanically match up with the terminals of the device at a specific testing temperature. Such designs would take into account for the physical properties of the device, e.g., the coefficient of thermal expansion (CTE) of a silicon wafer, the CTE of the probe card, and the temperature of the testing. However, a probe card that matches a device at one temperature (e.g., room temperature) may not adequately match the device at a significantly different test temperature (e.g., 120° C. or higher). As a result, using materials differing from those in the devices being tested may provide a higher contact resistance at the higher temperature or in the extreme case cause an open contact. Accordingly, a second probe tip pattern can be designed to match the device at the elevated temperature.

Figure 8A:
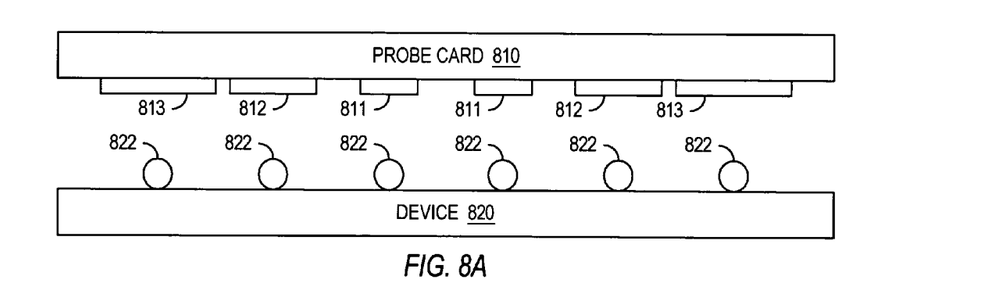
FIGS. 8A and 8B illustrate a probe card that maintains alignment with a device being tested over a range of temperatures.
Figure 8B:
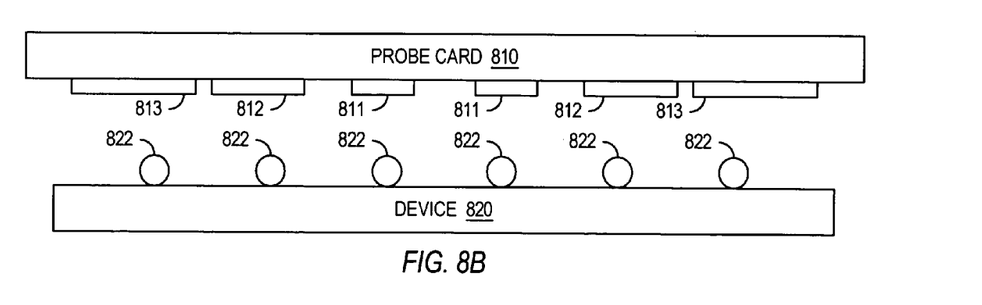

In accordance with a further aspect of the invention, even if a probe does not contain the same materials as the device being tested, the pattern and size of probe tips on the probe can make proper contact with the terminals of a device over a wide range of temperatures. FIGS. 8A and 8B show a probe 810 having probe tips 811, 812, and 813 that increase in size with distance from the center of probe 810. For probing, the center of probe 810 is aligned with the center of a device 820. FIG. 8A illustrates how terminals 822 of device 820 then align with probe tips 811, 812, and 813 at a first temperature (e.g., room temperature.) An "at-temperature" test can be performed at an elevated temperature (e.g., at 120° C.). As a result, thermal expansion of device 820 may differ from expansion of probe 810 because of a difference in their respective coefficients of thermal expansion (e.g., a difference between the CTE of a silicon wafer and the CTE of a printed circuit board.) Normally, a differential expansion of device 820 would move each terminal 822 relative to the corresponding tip 811, 812, or 813, with the amount of movement being proportional to the distance between the terminal 822 and the center of device 820. To compensate for the differential expansion, pads 811, 812, and 813 are sized to extend over the range of positions of the corresponding terminals 822 so that portions of pads 811, 812, and 813 remain aligned with terminals 822 even at the elevated temperature illustrated in FIG. 8B.

Figure 9A:
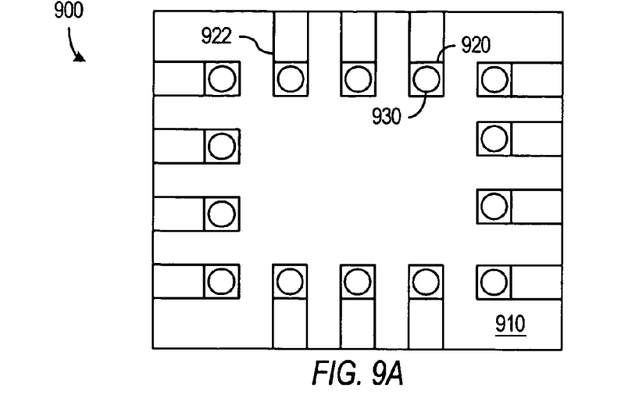
FIGS. 9A, 9B, 9C, 9D, and 9E illustrate probing systems using semiconductor probe devices in accordance with alternative embodiments of the invention.

The problem of differential thermal expansion can be reduced or eliminated when the probe tips are on a semiconductor probe device having the same coefficient of thermal expansion as the device being tested. FIG. 9A shows a plan view of a probe 900 including a semiconductor die 910 that is preferably made of the same material as the devices to be probed. Contact pads on semiconductor die 910 have a pattern that is the same as the pattern of contact pads on the tested devices. Optionally, semiconductor die 910 can further include additional contact pads or traces 922 for electrical connection to the remainder of a probe card (not shown in FIG. 9A). In one embodiment of the invention, contact pads 920 are fabricated on die 910 using a mask and/or a manufacturing process that is substantially identical to the process used in fabricating contact pads on the devices to be tested. Die 910 can even be a device of the type being tested. Additional traces or contact pads 922 can then be added to die 910 if necessary using one or more additional patterned layers formed during separate processing steps. Alternatively, contact pads 920 and traces 922 can be portions of the same patterned layer or interconnect structure.

Probe tips 930 are on contact pads 920. Probe tips 930 can be fabricated using conventional bumping technology that is well known for forming bumps or pillars for flip-chip bonding. Alternatively, pads 920 can serves as the probe tips, and bumps 930 can be omitted. As disclosed above, the probe tips are preferably made of material such as copper that is more resilient than the surface material on the terminals of the devices being tested. A lapping process, chemical mechanical polishing (CMP), or any other precision process can planarize the probe tips, whether bumped or not, to a high accuracy (e.g., to within a micron or less.)

Figure 9B:
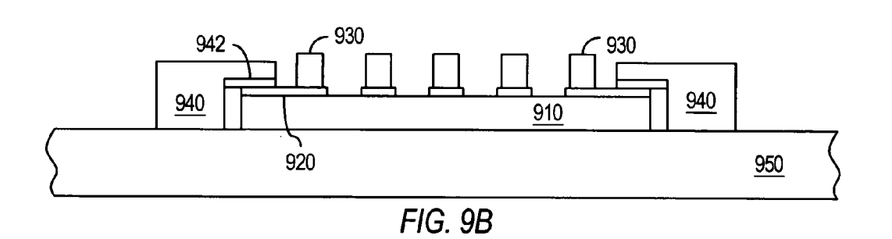

Probe 900 can be detachably mounted on a probe card as illustrated in FIG. 9B. In FIG. 9B, a receptacle 940 on a probe card 950 has electrical contacts 942 that contact pads 922 when die 910 is held in receptacle 940. Receptacle 940 can preferably be opened or disassembled to permit removal and replacement of die 910. For testing, probe tips 930 on die 910 have electrical connections through pads 920 and 922 to contacts 942 and from contacts 942 through receptacle 940 to probe card 950. Probe card 950 can then connect to test equipment in the same manner as described above in regard to FIG. 3.

Figure 9C:
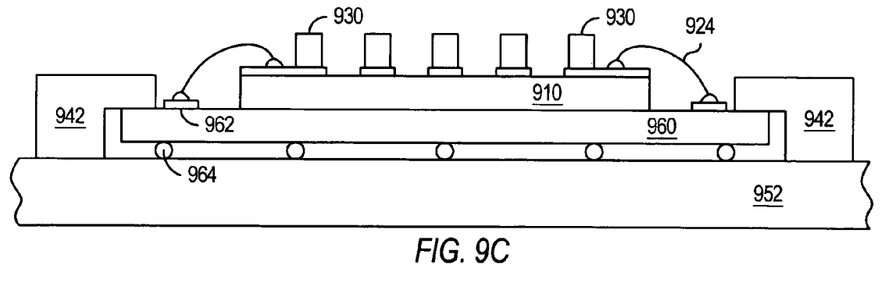

FIG. 9C shows an alternative configuration in which die 910 is on a top surface of a printed circuit board or interconnect substrate 960, and a probe assembly including die 910 and substrate 960 is then detachably mounted in a receptacle 942. In the illustrated embodiment, wire bonds 924 electrically connect pads 922 on the top surface of die 910 to respective pads 962 on interconnect substrate 960. Alternatively, tape bonding or flex circuit bonding could be similarly used to electrically connect pads 922 to substrate 960. Traces (not shown) in and on substrate 960 electrically connect pads 962 to terminals 964 on a bottom side of substrate 960, and terminals 934 electrically contact pads or traces (not shown) on a probe card 952, completing the electrical connection of probe tips 930 to probe card 952. An advantage of the embodiment of FIG. 9C is that receptacle 942 does not require electrical connections and is sized to accommodate interconnect substrate 960, which would typically be larger than semiconductor die 910. Additionally, substrate 960 places probe device 910 at a higher elevation relative to probe card 952. These features may make receptacle 942 easier to manufacture than receptacle 940 of FIG. 9B.

Figure 9D:
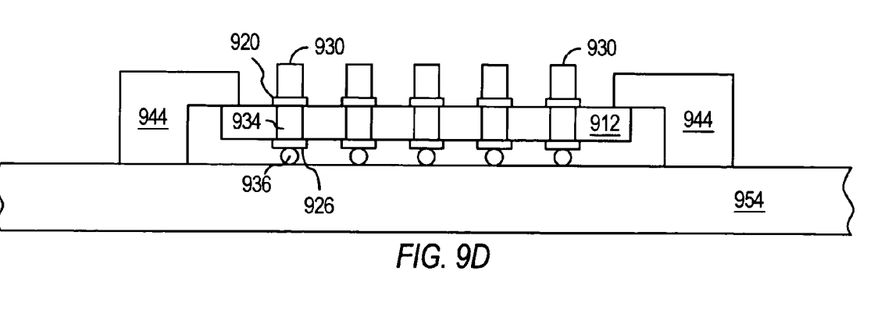

FIG. 9D shows another exemplary embodiment of the invention including a semiconductor probe device 912. Probe device 912 differs from probe device 900 of FIG. 9A in that electrical terminals of probe device 912 are on a bottom surface of probe device 912. More specifically, probe device 912 includes contact pads 920 and probe tips 930 on a top surface. Conductive vias 934, which are connected to contact pads 920, pass through the semiconductor die and electrically connect contact pads 920 to respective contact pads 926 on the bottom surface of probe device 912.

One process for fabricating probe device 912 performs laser drilling, directional etching such as deep ion etching, or any high aspect ratio etching process to form holes through a semiconductor die in the areas of contacts 920. The holes can then be filled with a conductive fill material such as aluminum, copper, tungsten, or a conductive epoxy. Alternatively, vias 934 may be formed through deep ion implantations or other doping processes. Contact pads 920 and probe tips 930 can then be formed at the top of conductive vias 934, and contact pads 926 and terminals 936 can then be formed at the bottom of conductive vias 934. Contact pads 920 generally have the same pattern as contact pads 926 and the contact pads on the devices to be tested. Similarly, probe tips 930 and terminals 936 can be formed using similar bumping processes.

A receptacle 944 holds probe device 912 in place with terminals 936 in contact with matching contact pads (not shown) on a probe card 954. Preferably, receptacle 944 is such that semiconductor probe device 912 can be removed and replaced when damaged or when reconfiguring test equipment to test a different type of device.

Figure 9E:
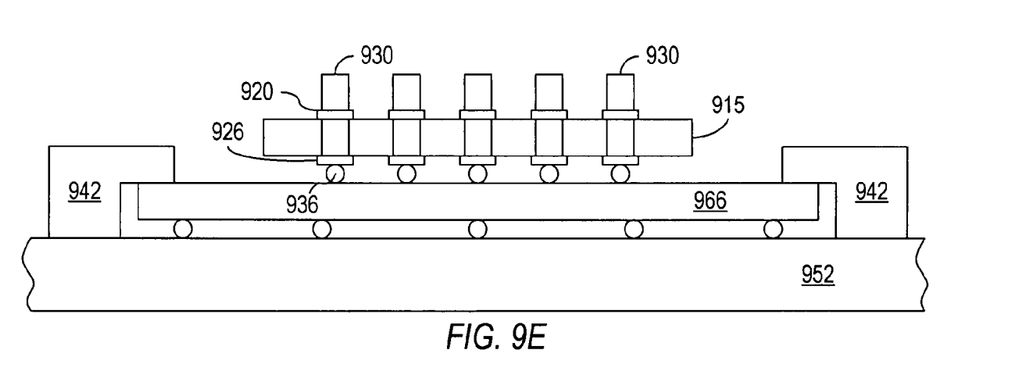

FIG. 9E shows an embodiment of the invention where the probe device 915 is connected to a printed circuit or interconnect substrate 966 instead of directly contacting a probe card 952. In this embodiment, terminals 936 preferably contain solder or other materials that can be used in a solder reflow process that attaches probe device 915 to substrate 966. Receptacle 942 can then be sized to detachably hold substrate 966. Since terminals 936 on probe device 915 typically have the same pattern as contacts on the devices being tested, substrate 966 can be substantially identical to the substrates used for flip-chip packaging of the devices being tested.

Although the invention has been described with reference to particular embodiments, the description is only an example of the invention's application and should not be taken as a limitation. Various adaptations and combinations of features of the embodiments disclosed are within the scope of the invention as defined by the following claims.

I claim:

1. A probing system for testing a device comprising:
    a probe comprising a semiconductor die and probe tips rigidly attached to the semiconductor die, wherein the probe tips comprise bumps that are arranged in a pattern that matches a pattern of terminals on the device and that directly contact the terminals during testing of the device, the probe tips being affixed to the semiconductor die so that the pattern of the probe tips expands/contracts with thermal expansion/contraction of the semiconductor die;
    a substrate on which the semiconductor die is mounted, wherein the substrate is substantially identical to an interconnect substrate used in a flip-chip package for the device;
    a probe card including a receptacle sized to hold the substrate, wherein the substrate is detachably mounted in the receptacle; and
    a tester electrically connected to the probe tips.

2. The system of claim 1, wherein the device comprises a semiconductor material that is substantially the same as material in the semiconductor die.

3. The system of claim 1, wherein the semiconductor die comprises:
    terminals on a bottom surface of the semiconductor die; and
    conductive vias that pass through the semiconductor die and provide electrical connections between the probe tips on a top surface of the die and the terminals on the bottom surface.

4. The system of claim 3, wherein the terminals of the semiconductor die directly contact the substrate.

5. The system of claim 4, wherein terminals on the substrate directly contact the probe card.

6. The system of claim 1, further comprising a positioning system adapted to position the probe relative to the device so that the probe tips contact the terminals on the device.

7. The system of claim 1, further comprising contact pads that are directly on the semiconductor die, wherein the bumps respectively reside on the contact pads.

8. The system of claim 7, wherein the contact pads have a pattern identical to corresponding contact pads on the device tested.

9. The system of claim 1, wherein surfaces of the bumps that contact the device are planar and in the same plane.

10. The system of claim 1, wherein the semiconductor die is substantially identical to the device.

11. The system of claim 1, wherein the bumps are of a type suitable for use in a flip-chip package.

12. The system of claim 1, wherein solder attaches the semiconductor die to the substrate.

13. The system of claim 1, wherein the bumps have compliancy that is limited so that testing deforms the terminals of the device.

14. The system of claim 1, wherein the substrate contains conductive traces that electrically connect contact pads on one side of the substrate to contact pads on an opposite side of the substrate.

* * * * *